United States Patent [19]

Liberman

[11] Patent Number: 5,442,326

[45] Date of Patent: Aug. 15, 1995

[54] ATOMIC TIME STANDARD WITH PIEZOELECTRIC STABILIZATION OF DIODE LASER LIGHT SOURCE

[75] Inventor: Irving Liberman, Squirrel Hill, Pa.

[73] Assignee: Westinghouse Electric Corporation, Pittsburgh, Pa.

[21] Appl. No.: 303,802

[22] Filed: Sep. 9, 1994

[51] Int. Cl.⁶ .............................................. H03L 7/26
[52] U.S. Cl. ........................................ 331/94.1; 331/3
[58] Field of Search ................................... 331/94.1, 3

[56] References Cited

U.S. PATENT DOCUMENTS

| 4,935,935 | 6/1990 | Reed et al. | 372/44 |
| 5,148,437 | 9/1992 | Ohtsu | 331/3 |
| 5,192,921 | 3/1993 | Chantry et al. | 331/3 |
| 5,327,105 | 7/1994 | Liberman et al. | 331/94.1 |

OTHER PUBLICATIONS

*Piezoelectrically Induced Stress Tuning of Electro–Optic Devices;* C. Y. Hung, T. E. Schlesinger, and M. L. Reed; Appl. Phys. Lett. 59(27), 30 Dec. 1991; pp. 3598–3600.
*Microelectromechanical Tuning of Electrooptic Devices;* C. Y. Hung, R. Burton, T. E. Schlesinger, M. L. Reed; Micro Electro Mechanical Systems '92; Travemunde (Germany), Feb. 4–7, 1992; pp. 154–157.

*Primary Examiner*—Siegfried H. Grimm

[57] ABSTRACT

The wavelength of light generated by a diode laser optically pumping vapor in the gas cell of an atomic time-standard is stabilized against variations in ambient temperature by application of pressure to the semiconductor laser by a piezoelectric transducer, preferably implemented as thin films on the diode structure. Closed loop control of the pressure is provided by feeding back a detector signal, which is a measure of light transmitted through the vapor, to a null seeking servo the output of which is converted to a control signal which is a function of temperature/pressure. The control signal, which is applied to the piezoelectric transducer, which in turn is preferably implemented as a thin film on the diode structure, can be dithered to sense and maintain the desired resonant atomic transition frequency. The vapor is additionally excited by a microwave signal locked to an atomic transition frequency through feedback of the detector signal.

5 Claims, 1 Drawing Sheet

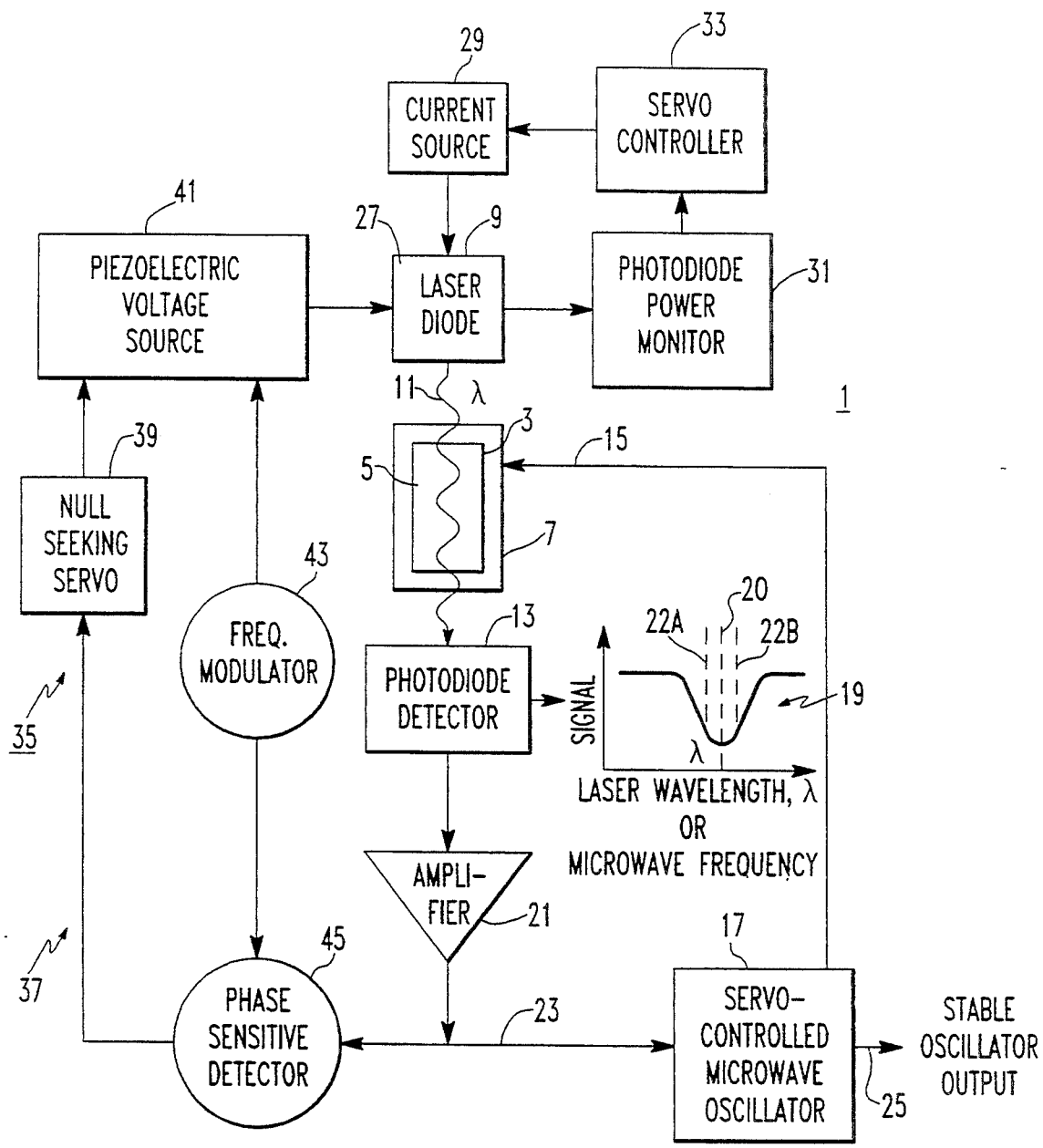

5,442,326

ATOMIC TIME STANDARD WITH PIEZOELECTRIC STABILIZATION OF DIODE LASER LIGHT SOURCE

BACKGROUND OF THE INVENTION

1. Field of the Invention

This invention relates to atomic time standards utilizing a diode laser to optically pump vapor in a gas cell which is also excited by a microwave signal regulated with respect to the atomic transition frequency of the vapor and from which a time standard signal is generated. More particularly, it is related to such a time standard in which the wavelength of light generated by the diode laser is electronically stabilized against variations in temperature.

2. Background of Information

Atomic frequency standards of the gas cell type provide very accurate timing information. They operate on the principal that certain element vapors have very precise atomic transition frequencies. The vapor is excited by a microwave signal tuned with respect to the atomic transition frequency. Light of another specific atomic transition in a beam passed through the gas cell is absorbed. A photodetector which detects light which has passed through the vapor is used in a feedback circuit to lock the microwave signal to the microwave atomic transition frequency of the vapor. A precise timing signal is output by the microwave circuitry with a stable frequency which is a fraction of the atomic transition frequency to which the microwave circuit it tuned. Commonly, the microwave circuit modulates the microwave signal applied to the gas cell between two frequencies on either side of the atomic transition frequency with the output signal being generated from an average of the two microwave frequency signals.

The operation of the above-described gas cell type atomic standard is dependent upon a stable light source. For this invention, the light source is a laser which is controlled with a feedback signal from the photodetector. Current efforts have been directed toward miniaturizing the gas cell type atomic standard. An example of such a cell-type atomic frequency standard is disclosed in U.S. Pat. No. 5,192,921. Such a miniaturized atomic frequency standard utilizes a diode laser as the light source and utilizes cesium vapor in the gas cell. A key feature of the operation of this atomic frequency standard is the laser diode excitation of a narrow ((<1 GHz)) hyperfine optical resonance transition at $\approx 852$ nm.

Simple internal cavity diodes can be locked to the required transition through a combination of temperature and current tuning. Temperature tuning is required for two purposes even though tuning can be achieved by varying the current to the diode. Current tuning can only shift the wavelength a relatively small amount compared with the variation of the diode laser center frequency as manufactured, even for diodes selected for a given wavelength region. However, even if diode lasers were manufactured with extremely close tolerances in maximum gain wavelength, current tuning does not vary the wavelength smoothly. Instead, it exhibits a phenomenon called "mode hopping" in which the wavelength shifts abruptly with current, then smoothly for a small wavelength region, and then abruptly and so on. That is, the shift is more like a staircase than a ramp.

In order to have the smooth ramp region at the desired wavelength, temperature regulation is required. The desired temperature control is not stringent ($\approx \pm 1°$ C.), but quite specific. Therefore, if the clock must operate in a wide thermal ambient, considerable power must be expended in heating or cooling the laser. In addition to compensating for variations in ambient temperature, cooling power is required to remove the electrical power dissipated in the laser if the desired operating temperature is near or below the ambient temperature. In diode lasers today which typically required $40 \approx 100$ mW electrical power and generate $\approx 10$ mW optical power, the bulk of the cooling power is required to remove the electrical power dissipated. On the other hand, it is anticipated that diode lasers for the miniature atomic frequency standards will require <10 uW optical power which can be obtained with <10 mW electrical power. Under these conditions, or by establishing a relatively high operating temperature, the bulk of the thermal control power will be due to fluctuations in the ambient temperature. Control of the temperature of the laser adds to the complexity, the cost and also the size of the atomic frequency standard, the latter of which is an important consideration in development of miniature atomic frequency standards.

There is a need, therefore, for an improved atomic frequency standard utilizing a diode laser light source which does not require stringent thermal control.

There is a related need for such an improved atomic frequency standard which is simple, economical, and compact.

SUMMARY OF THE INVENTION

It is an object of the invention to eliminate the need for stringent thermal control of a diode laser used as a light source in an atomic frequency standard.

It is another object of the invention to provide such an improved atomic frequency standard which has minimal power requirements to stabilize the diode laser operation against variations in ambient temperature.

The above needs are met and objects realized by the invention which is directed to an atomic frequency standard which utilizes electronic means to stabilize operation of the diode laser against ambient temperature variations. More particularly, the atomic frequency standard of the invention utilizes a piezoelectrically controllable diode laser in which a piezoelectric transducer applies a mechanical strain to the diode laser in proportion to an applied voltage to establish and regulate the wavelength of light generated by the diode laser in response to variations in ambient temperature. The voltage for the piezoelectric transducer is generated in a feedback loop from a detector signal generated by a photodiode which responds to light from the diode laser which passes through the vapor in the gas cell. This feedback loop contains a null sensor generating a null signal which is used to generate the control voltage which is applied to the piezoelectric transducer. The laser wavelength can be modulated about the desired optional resonance wavelength by frequency modulating the control signal applied to the piezoelectric transducer.

Specifically, the invention is directed to:

An atomic frequency standard comprising:

a gas cell containing a vapor having specified atomic transitions including an optical resonance wavelength and microwave atomic transition frequency;

oscillator means generating a microwave signal in a frequency range including said microwave atomic transition frequency;

means coupling said microwave signal to said gas cell;

a piezoelectrically controllable laser diode optically pumping said vapor in said gas cell with light at a wavelength within a range including said optical resonance wavelength;

detector means generating a detector signal representing light from said laser diode which has passed through said vapor in said gas cell;

means applying said detector signal to said oscillator means for operating said oscillator means to regulate said microwave signal as a function of said specified microwave atomic transition frequency and to generate an output signal of a stable frequency related to said specified atomic transition frequency; and laser wavelength control means responsive to said detector signal controlling said piezoelectrically controllable laser diode to stabilize the wavelength of the light generated thereby.

BRIEF DESCRIPTION OF THE DRAWINGS

A full understanding of the invention can be gained from the following description of the preferred embodiments when read in conjunction with the accompanying drawing which is a schematic diagram in block form of an atomic frequency standard in accordance with the invention.

DESCRIPTION OF THE PREFERRED EMBODIMENT

Referring to the drawing, the invention will be described as applied to an atomic frequency standard of the type described in U.S. Pat. No. 5,192,921 which is hereby incorporated by reference. The atomic time standard 1 includes a gas cell 3 containing a gas vapor 5, which in the exemplary embodiment of the invention includes cesium, located within a microwave cavity 7. A source of light 9 is positioned to pass a beam of light 11 through the vapor 5 to a photodiode detector 13. The source of light 9 which is a diode laser to be discussed in more detail, generates light with a predetermined wavelength, known as the optical resonance wavelength, which will be absorbed by the vapor atoms 5 in a ground state, causing them to move to an excited energy state. Light with a wavelength of $\approx 852$ nm pumps cesium atoms from a hyperfine level of the ground state to a resonance state. Depopulation of this ground state causes the light passing through the vapor 5 to the photodiode detector 13 to increase. While eventually the cesium atoms will return to the ground state, relaxation is slow. However, repopulation of the ground state can be stimulated by a microwave signal 15 generated by a microwave oscillator 17 operated at a microwave atomic transition frequency of the gas vapor 5, which for cesium is approximately 9.19 GHz. By repopulating the hyperfine ground level, the microwave signal 15 increases the amount of light absorbed by the vapor 5. Therefore, the amount of light passing through the gas cell 3 to the detector 13 will decrease to a minimum value when the frequency of the oscillator 17 is precisely at the desired microwave atomic transition frequency. As discussed above, the microwave signal 15 can be tuned precisely to the desired frequency or can be modulated between two frequencies centered on the desired frequency. The detector signal generated by the photodiode detector 13 is amplified by an amplifier 21 and fed back through a lead 23 to the oscillator 17. The microwave oscillator 17 precisely controls the microwave signal to the desired frequency or modulated frequency. As is known, such microwave oscillators 17 utilized in atomic time standards generate a stable oscillator output signal 25 which is a fraction of the atomic transition frequency to which the microwave signal is tuned. For instance, this stable oscillator output signal can be a precise 10 MHz signal.

As mentioned, the light source 9 is a diode laser, and in particular a piezoelectrically controlled diode laser. A piezoelectrically controlled diode laser is illustrated in U.S. Pat. No. 4,935,935 which is hereby incorporated by reference. This diode laser 9 is a semiconductor device having a piezoelectric transducer 27 applied to the semiconductor device such that when a control voltage is applied to the transducer, a stress is transmitted to the laser device which varies the wavelength of the light generated. The laser diode 9 is powered by a current source 29. A photodiode 31 monitors the power generated by the diode laser for use by a servo controller 33 in controlling the current source 29 to regulate the laser power output.

As discussed above, even at constant current, the wavelength of the light generated by the diode laser 9 will vary with temperature. The piezoelectric transducer 27 applies pressure to the semiconductor laser to offset the change in wavelength of the light generated caused by the change in ambient temperature. Wavelength shifts of nanometers can be achieved by compressive pressure of thousands of psi. However, since the area of the diode is small (less than about 1 mm$^2$) the force required is quite low. Pressures required are easily achieved with the piezoelectric transducer 27 which is deposited as thin films and operated at moderate voltage. As in the case of temperature tuning, multiple mechanisms occur with pressure tuning including both a change in band gap as well as a change in the optical length of the resonating cavity of the laser. The change in optical length determines where the "mode hops" occur, and therefore appropriate selection of parameters should be made such that the fine tuning takes place in a linear region around the wavelength of interest.

A pressure/wavelength control 35 regulates the pressure applied to the laser diode by the piezoelectric transducer 27 to maintain the wavelength of the light generated by the laser diode 9 at the atomic resonance transition. The pressure/wavelength control 35 comprises a feedback circuit 37 which is responsive to the signal generated by the photodiode detector 13 to generate a control voltage which is applied to the piezoelectric element 27. The feedback circuit 37 includes an amplifier 21 which feeds a phase sensitive detector 45. The phase sensitive detector is also fed by a frequency modulator 43 generating a modulation signal which simultaneously dithers the voltage/pressure/wavelength of the laser diode 9 via the piezoelectric voltage source 41. The piezoelectric voltage source 41 also receives a bias signal from the null seeking servo 39. As shown by the response curve superimposed on the drawing at 19, when the dithered wavelengths 22A and 22B are symmetrical around the minimum wavelength 20, the signal output for the two wavelengths 13 is the same, which is the condition sought by the null seeking servo 39. If the dithered signal is not symmetric about wavelength 20, the difference signal increases, and the phase reverses depending on whether the wavelengths are too high or too low. The null seeking servo 39 then alters the signal to the piezoelectric voltage source so as to drive the laser dither to be symmetrical about the minimum wavelength 20.

The use of pressure tuning with a piezoelectrically controllable diode laser of an atomic time standard eliminates the need for thermal control power. It provides a fast control response time enabling greater stability of power and wave length. The range of control provided means that the wavelength tolerance of the laser can be lowered therefore increasing the laser yield, which in turn will reduce cost. In addition, the pressure control of the invention allows the atomic time standard to operate over a wider ambient temperature range than is possible with thermal control. Finally, it provides potentially longer laser life by eliminating the compromising higher laser operating temperatures which have been used to reduce the effects of variations in ambient temperature. The piezoelectrically controlled diode laser light source for atomic time standards reduces power required as the electrical power required to maintain the pressure is negligible since the piezoelectric material has the electrical characteristics of a high quality capacitor, which with the dc excitation requires negligible current and power.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. An atomic time standard comprising:
    a gas cell containing a vapor having specified atomic transition frequencies/wavelengths including an optical resonance wavelength and a microwave atomic transition frequency;
    oscillator means generating a microwave signal in a frequency range including said microwave atomic transition frequency;
    means coupling said microwave signal to said gas cell;
    a piezoelectrically controllable diode laser optically pumping said vapor in said gas cell with light at a wavelength within a range including said optical resonance wavelength;
    detector means generating a detector signal representing light from said diode laser which has passed through said vapor in said gas cell;
    means applying said detector signal to said oscillator means for operating said oscillator means to regulate said microwave signal as a function of said microwave atomic transition frequency and to generate an output signal of a stable frequency related to said microwave atomic transition frequency; and
    laser wavelength control means responsive to said detector signal controlling said piezoelectrically controllable diode laser to stabilize the wavelength of the light generated thereby.

2. The atomic time standard of claim 1 wherein said piezoelectrically controllable diode laser is responsive to a control voltage to stabilize the wavelength of said light generated thereby, and wherein said laser wavelength control means comprises a feedback circuit responsive to said detector signal and generating said control voltage.

3. The atomic time standard of claim 2 wherein said feedback circuit comprises a null seeking servo responsive to said detector signal and a piezoelectric voltage source controlled by said null seeking servo to generate said control voltage applied to said piezoelectrically controllable laser diode.

4. The atomic time standard of claim 2 wherein said laser wavelength control means further includes frequency modulator means frequency modulating said control voltage.

5. The atomic time standard of claim 4 wherein said frequency modulator means comprises means generating a frequency modulation signal, and phase sensitive means applying said frequency modulation signal to said detector signal, and wherein said feedback circuit includes null seeking servo means responsive to said detector signal to which said frequency modulation signal has been applied to generate a bias signal, and piezoelectric voltage generating means responsive to said bias signal and to said frequency modulation signal to generate a frequency modulated control signal which is applied to said piezoelectrically controllable diode laser, whereby said wavelength of said light generated by said laser diode to pump said vapor in said gas cell is dithered about said specified resonant atomic transition.

* * * * *